United States Patent [19]

Sarkary

[11] 4,109,275
[45] Aug. 22, 1978

[54] INTERCONNECTION OF INTEGRATED CIRCUIT METALLIZATION

[75] Inventor: Homi G. Sarkary, Hopewell Junction, N.Y.

[73] Assignee: International Business Machines Corporation, Armonk, N.Y.

[21] Appl. No.: 753,240

[22] Filed: Dec. 22, 1976

[51] Int. Cl.² .................... H01L 23/48; H01L 29/44; H01L 29/52
[52] U.S. Cl. ........................................ 357/68; 357/71; 357/73
[58] Field of Search ....................... 357/67, 68, 71, 73

[56] References Cited

U.S. PATENT DOCUMENTS

| 3,303,071 | 2/1967 | Kocsis | 357/68 |
| 3,390,308 | 6/1968 | Marley | 357/68 |
| 3,577,036 | 5/1971 | Curtis | 357/71 |
| 3,577,175 | 5/1971 | Gri | 357/71 |
| 3,751,292 | 8/1973 | Kongable | 357/71 |
| 3,823,349 | 7/1974 | Dhaka et al. | 357/68 |
| 3,855,610 | 12/1974 | Masuda et al. | 357/71 |
| 4,000,502 | 12/1976 | Butler et al. | 357/68 |
| 4,023,197 | 5/1977 | Magdo et al. | 357/71 |

OTHER PUBLICATIONS

IBM Technical Disclosure Bulletin; Barrel Connector, by Kryzaniusky, vol. 14, No. 9, Feb. 1972, p. 2599.

Primary Examiner—Andrew J. James
Attorney, Agent, or Firm—Henry Powers

[57] ABSTRACT

In the fabrication of integrated circuits, step or ridge peak problems in forming via openings through sputtered quartz coatings to underlying metallization are minimized by subdividing the contact portions thereof into a plurality of adjacent line segments, and forming the via opening between the elevations or peaks on the line segments to expose portions thereof for interconnection by higher metallization levels.

20 Claims, 15 Drawing Figures

INTERCONNECTION OF INTEGRATED CIRCUIT METALLIZATION

FIELD OF THE INVENTION

This invention relates to integrated circuits and, more particularly, to interconnections between multilevel conductor patterns for integrated circuits.

DESCRIPTION OF THE PRIOR ART

In the construction of thin film integrated semiconductor circuits wherein a passivating or insulating film or layer, e.g. quartz, is sputter-deposited over a raised conductive line pattern, e.g., metallization pattern, on a substrate, the insulative film follows the contours of the underlying metallization pattern, i.e., the insulative layer will have raised portions or elevations corresponding to said pattern.

U.S. Pat. No. 3,983,022, granted Sept. 28, 1976 to R. P. Auyang et al. and assigned to the assignee of the present invention, describes a method of removing all elevations from a deposited insulative layer (e.g. quartz) by resputtering to completely planarize the surface of the layer. Such complete planarization of insulative layers was considered to be particularly desirable in structures having several levels of metallurgy separated by several layers of insulative material. In such multilayered structures, cumulative effects of several levels of raised metallization on the final insulative layer would be very pronounced and undesirable. Consequently, the advantage of completely planarizing each of the several insulative layers to avoid the overall cumulative effect is apparent. Such complete planarization by resputtering is very effective. However, it is time-consuming. For example, it takes up to about 24 hours of RF resputtering to completely planarize a conventional quartz (or silicon dioxide) layer deposited over a metallization pattern having raised lines in the order of 300 to 1500 micro-inches in width, a typical width employed in present day large scale integrated circuit structures.

The phenomenon of resputtering, in general, is known in the art and involves the re-emission of deposited insulative material, such as quartz, during the sputter deposition thereof through the effects of attendant ion bombardment of the deposited insulative layer. A more extended description of the system is set forth in U.S. Pat. No. 3,804,738 granted Apr. 16, 1975 to J. S. Lechaton et al., and assigned to the assignee of the present invention.

While resputtering has been used to some extent in the commercial fabrication of integrated circuits for the purpose of improving the quality of sputter deposited film, the use of resputtering for complete planarization has been quite limited because of the great amount of time necessary to achieve complete planarization of an insulative layer deposited over raised metallized line patterns of conventional width. While a conventional raised line metallization pattern will have lines of varying widths, the low resistance requirements of a great many of such lines in a given pattern, such as power distribution lines, will require wide metallization lines and, consequently, wide elevated portions in the insulative overlayer. Such wide elevations introduce a time factor in the planarization step which, in many cases, may render complete planarization impractical. Consequently, the use of complete planarization in the integrated circuit fabrication industry is fairly limited, and most of the industry tries to "live with" the insulative layer elevations resulting from the raised metallization pattern. Where only a few levels of metallization are needed in the integrated circuit, the accumulated effect of insulative layer elevations may still be tolerable.

Unfortunately, it has been found that even in structures where the accumulated effect of the insulative layer elevation is tolerable, such elevations produce a very significant disadvantage in forming a via hole through the insulative layer elevation to the underlying metallic line. When the elevation in the insulative layer is chemically etched through to provide a via hole in accordance with standard techniques, the via opening being etched will reach the side of the metallic line and even the bottom of the metallic line before all of the insulative material above the line is removed. Then, while the remainder of the insulative material above the metallic line in the via hole is being removed, the tunneling effect by the etchant laterally along the side of the metallic line will take place which will result in an undesirable fissure which is a structural flaw in addition to being a defect through which subsequent etching steps may provide a short circuit path through any insulative layer underlying the metallic line to the semiconductor substrate. This tunneling effect is apparently due to a preferential etching phenomenon along the side of the line.

The aforesaid U.S. Pat. No. 3,804,738 describes a method of forming an electrically insulative layer over an integrated circuit substrate having a conductive raised line pattern, e.g. metallization pattern, formed thereon comprising the steps of forming on said substrate, a conductive raised line pattern having at least a portion of the line pattern narrower in width than the remainder of the pattern; then, depositing over said substrate an electrically insulative layer whereby said layer has narrower and wider raised portions corresponding to the underlying portions of said line pattern, and resputtering said insulative layer for an amount of time sufficient to planarize the narrower raised portions of said layer to the level of the unraised portions of the layer but insufficient to so planarize the wider raised portions of said layer. In carrying out this method, the metallization pattern is arranged so that the narrower line in the pattern will be at the positions at which the via holes are to be subsequently formed. Consequently, when the via holes are subsequently formed using conventional selective chemical etching, the insulative layer through which the via holes are to be formed, having been previously planarized, will be relatively shallow and close to the underlying metallization line.

However, even by this technique, unless the deposition (e.g. sputtering/resputtering) is carried out for an extended time (of substantial duration undesirable from an economic standpoint) step or peaked ridges will remain along the coextension of the conductor pattern, with a height substantially that of the conductor height. Such retention of the insulating coating (e.g. quartz) will encounter to a degree some of the problems of the above-described tunneling effect, if its complete removal is attempted.

Additional Art of Interest

U.S. Pat. No. 3,442,003, issued May 6, 1969
U.S. Pat. No. 3,766,448, issued Oct. 16, 1973 (see in 2) col. 4, 11.14-23 and FIG. 2)
U.S. Pat. No. 3,801,880, issued Apr. 2, 1974

U.S. Pat. No. 3,804,738, issued Apr. 16, 1974 (see in particular col. 8, 11.14-30 and FIG. 4)
U.S. Pat. No. 3,983,022, issued Sept. 28, 1976

SUMMARY OF THE INVENTION

Accordingly, it is an object of this invention to provide for integrated circuit technology via holes, through insulative layers, such as quartz, having elevations corresponding to an underlying conductive line pattern which is free of tunnelling effects along the side of the conductive line.

It is another object of this invention to provide between multi-level metallization of integrated circuit structures, via holes through separating insulating layers which have elevations corresponding to underlying metallization without need for complete planarization of the insulation.

It is a further object of this invention to provide via holes in insulating layers covering conductor of semiconductor devices, without need for complete planarization of the insulator coating characterized with elevations corresponding to the extension of the conductor line.

In accordance with the foregoing, the present invention comprehends the modification of a conductor line in the desired contact areas of a metallization pattern coated over an insulating layer of an integrated circuit structure for interconnections to higher level conductor patterns. This modification of the conductor line comprises splitting (as by photolithographic techniques) into a plurality of spaced segments retained, for example, in parallel electrical contact with the parent body of the line, which together form a raised pattern on the insulation. A second insulating or dielectric coating is then formed over the metallization pattern to encase or sandwich it between coatings and the prior first laid insulating layer. This insulating coating will be characterized with a narrow step or peak coextending centrally (over center portion thereof) with the conductor lines or runs of the metallurgical pattern. Such ridge extensions form a typical characteristic of a coating of quartz deposited by resputtering techniques which comprise positive ion bombardment of the forming passivating (e.g. insulating) film during its sputter deposition.

In the next operation, via holes in the overlying insulating layer are formed at the contact sites between the coating ridges on the line segments, both in register with the spacing between the line segments and also in overlying or overlapping relationship with portions thereof so as to bare these segment portions for electrical contact access by a successive overlying metallization layer, as required for multi-conductor layer structures in integrated circuit fabrication.

The foregoing and other objects, features and advantages of the invention will be apparent from the more particular description and preferred embodiments of the invention, as illustrated in the accompanying drawings.

DESCRIPTION OF PREFERRED EMBODIMENTS

Figure 1:
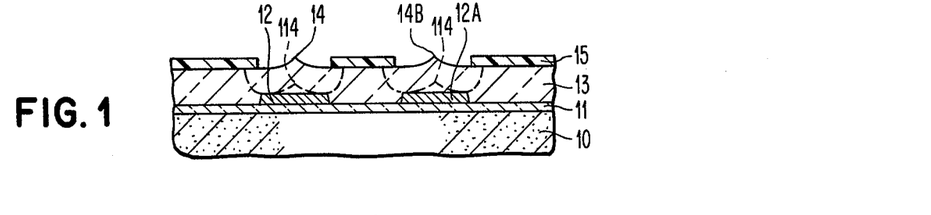
FIG. 1 is a partly sectional view in perspective.

The structure shown in FIG. 1 is a portion of an integrated circuit chip showing the effect of a line in a metallization pattern on the insulative layer deposited over the metallization pattern as encountered in resputtering techniques. However, it is to be understood that for purposes of simplicity, the showing of integrated devices has been omitted, and may comprise any of the conventional devices employed in fabrication of integrated structures, and can include, among others, bipolar structures, field effect transistors, diodes, resistors, and the like.

The structure may be formed by any conventional integrated circuit fabrication techniques, such as those described in U.S. Pat. No. 3,539,876. Silicon substrate 10 has formed thereon a top layer of insulative material 11 which may be silicon dioxide formed by the thermal oxidation of the surface of substrate 10 or a material deposited by chemical vapor deposition or sputtering. Such materials include silicon dioxide, silicon nitride, combined silicon dioxide-silicon nitride composites, aluminum oxide, and the like. Layer 11 acts to passivate or protect silicon substrate 10 as well as to insulate the substrate 10 from a metallization interconnection pattern of which lines 12 and 12A are a portion. The metallization pattern is formed on layer 11 by conventional integrated circuit fabrication techniques as described in U.S. Pat. No. 3,539,876, e.g., by chemical etching or sputter deposition. The metallization pattern is selectively connected to devices at the surface of substrate 10 by connectors, not shown, selectively passing through insulative layer 11 to the substrate. The metallization pattern is covered by an overlayer 13 of insulative material, such as quartz, which protects and insulates the metallization pattern. Since it is necessary to selectively access lines 12 in the metallization pattern from above at selective sites in order to provide contacts for "off-chip" connections or to connect lines 12 with a second level metallization pattern to be deposited on insulative layer 13, the via holes must be made through insulative layer 13 to lines 12. Because conventional deposition techniques provide a layer 13 of substantially uniform thickness, the layer will contain elevations 14 in the form of step or peak ridges corresponding to and coextending with underlying metallization lines 12. Typical reproduction of these ridges is the step ridge 14A shown in FIG. 1A and the peak ridge 14B shown in FIG. 1B. Heretofore, the via holes were formed through such elevations with various attempts to minimize these deviations as discussed above. A via hole which is to be opened is shown in phantom lines on layer 13. Standard techniques for forming such via holes involve defining the via holes with an etched resistant photoresist 15, as shown in FIG. 1, followed by etching with a standard etchant for insulative material, as described in U.S. Pat. No. 3,539,876, until the top surface of metallization line 12 is exposed by the hole; a conventional etchant is buffered HF where insulative layer 13 is silicon dioxide. Metallization pattern 12 may be any conventional metal used in integrated circuits, such as aluminum, aluminum-copper alloys, platinum, palladium, chromium, or molybdenum, conventionally used in integrated circuits.

As has been previously mentioned, because the top insulative coating (e.g. quartz) follows in elevations coextensive with the raised conductor lines, unless inordinate times (from an economic standpoint) in the deposition of the coating by resputtering techniques, the resulting coating is characterized with a ridge 14B which follows centrally of the conductor line extensions. Accordingly, on etching of the coating, a peaked coating 114, as shown in phantom in FIG. 1, remains as the metallurgy is reached. Further etching of this residual layer of coating results in a tunneling effect, as described in the aforesaid U.S. Pat. No. 3,804,738.

In contrast with the prior approaches, the present invention is able to disregard these elevations by modification of the conductor pattern, by subdivision of a conductor run 22 (see FIGS. 2A–2G) into a plurality of spaced segments 22A and 22B often electrically in parallel between remaining portions of conductor run 22. However, it is to be understood that the spaced segments can constitute terminal portions of a conductor line, in the form of a bifurcation of the end of a conductor run 122 (see FIG. 2H) into spaced end segments 122A and 122B.

Also, the conductor pattern may comprise a plurality of spaced conductor portions (see FIG. 3C) comprising an extended conductor run 222A for electrical connection to spaced conductor portions or islands 222B.

Figure 2A:
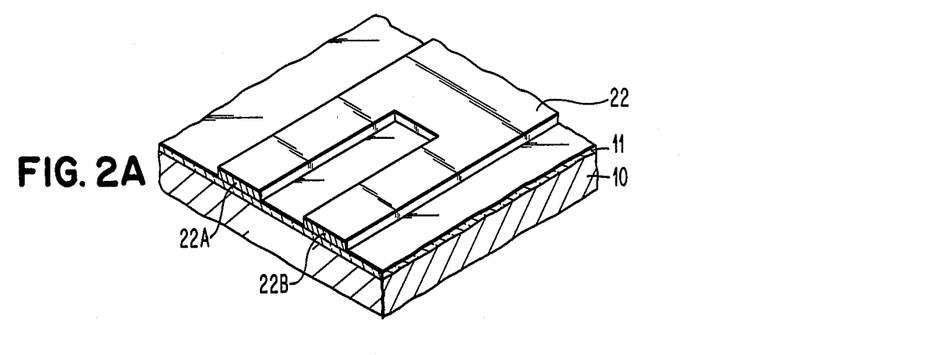
FIGS. 2A through 2G are partial cross-sectional views in perspective illustrating various stages in the formation of via holes in accordance with this invention, with FIG. 2H illustrating an embodiment of a conductor line comprehended herein.
Figure 2B:
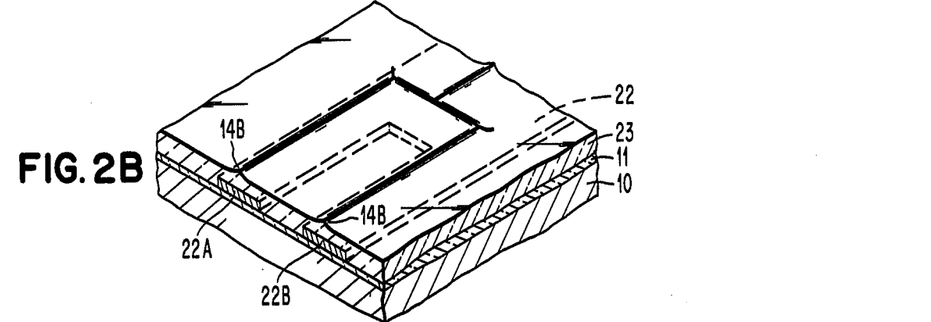
Figure 2C:
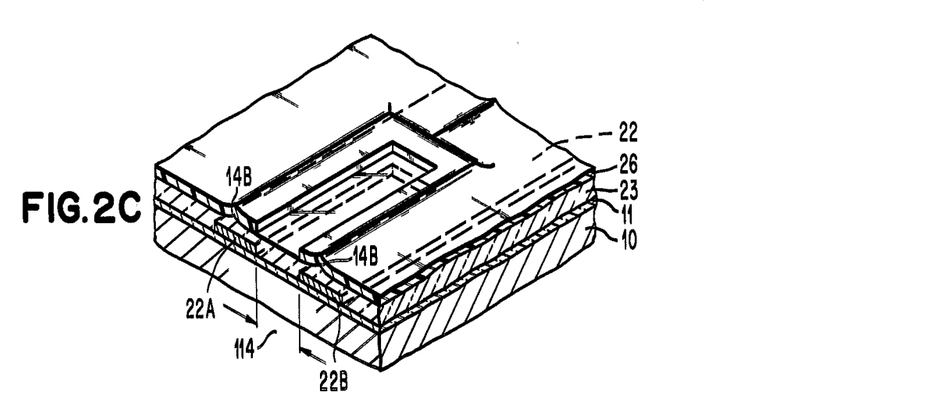
Figure 2D:
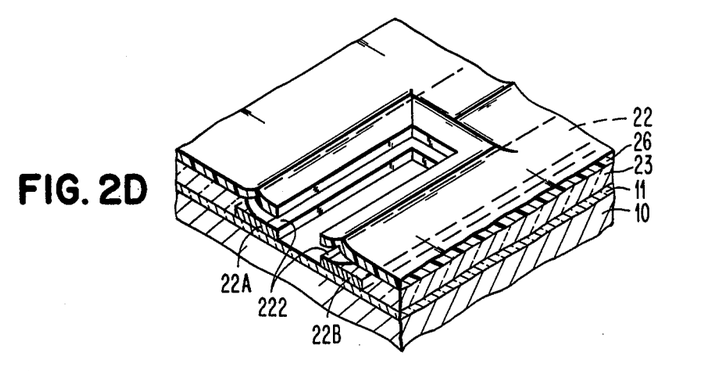

The initial structure comprises, as shown in a cross-sectional perspective view 2A, a silicon substrate 10, a layer 11 which may be silicon dioxide or silicon nitride, as well as the metallization pattern. Then, in accordance with one embodiment of the present invention, silicon dioxide layer 23, preferably quartz, is deposited utilizing conventional sputtering techniques and equipment to provide the structure shown in FIG. 2B. These techniques and equipment may conveniently be conventional RF sputtering approaches for the deposition of insulative material. However, since resputtering techniques are comprehended for partial planarization, equipment utilized to deposit initial layer 23, as shown in FIG. 2B, may be standard resputtering equipment which has been previously mentioned and will be subsequently described in greater detail. When utilizing such resputtering equipment for the initial deposition of layer 23, the equipment may be adjusted so that there is substantially controlled remission or removal of material from the layer being deposited, and the cycle is primarily one of deposition.

Figure 1A:
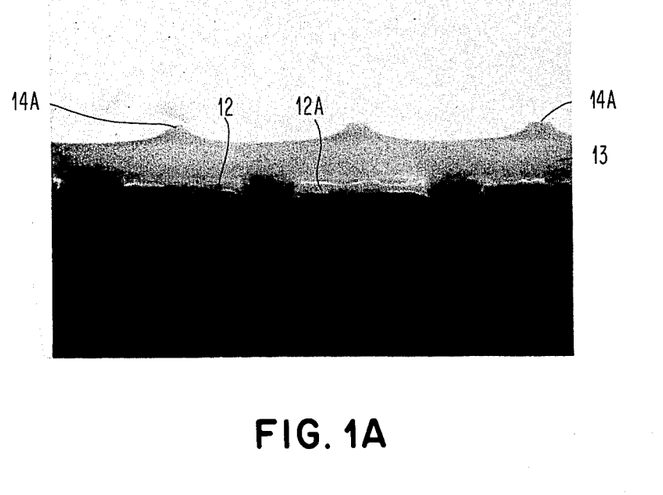
FIGS. 1A and 1B are reproductions illustrating resulting step and/or peak ridges in insulating coatings deposited over electrical conductors of a metallization pattern such as employed with integrated structures.

Next, utilizing standard resputtering equipment which may conveniently be prior art RF resputtering apparatus shown in FIG. 4, the operation of which will be hereinafter described in greater detail, insulative layer 23 is resputtered at a resputtering coefficient of about 0.5 to about 0.75 i.e., the final rate of deposition of insulative material onto layer 23 is about 125A/min to about 300A/min. During deposition (resputtering), the coating, as is builds up the normal elevation, begins to narrow inwardly from the edges. FIG. 1A shows the structure at an intermediate stage during resputtering wherein the elevations are characterized as step ridges 14A over the conductor portions 22A and 22B.

Upon the completion of the resputtering, as shown in FIG. 2B, a substantially planarized structure is obtained in which the normal elevation is substantially eliminated but still characterized with a peaked ridge 14B over narrower metallization line portions 22A and 22B.

Figure 1B:
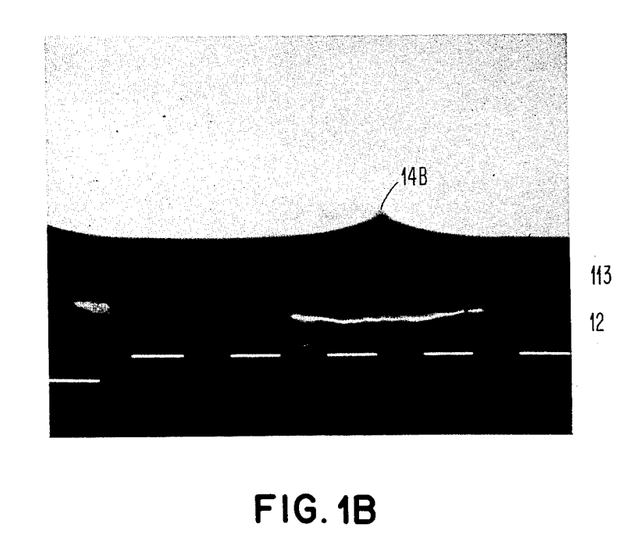
Figure 2E:
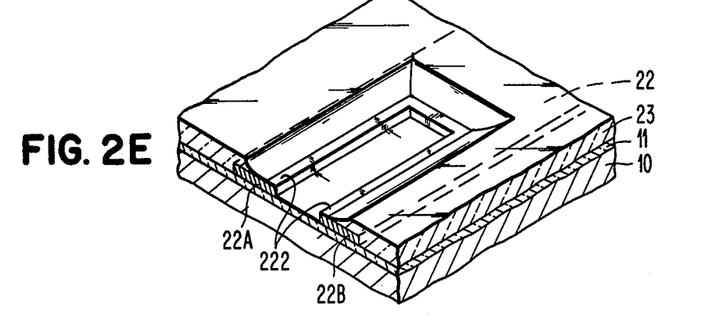

As indicated previously, the resputtering technique involves the simultaneous deposition and removal of the coating material (e.g. quartz) at a rate characterized by a resputtering coefficient defining the rate of deposition of material relative to the rate of removal. For this purpose, the same conventional RF resputtering apparatus, as illustrated in FIG. 4, may be utilized for this simultaneous process. However, in conducting the deposition and resputtering simultaneously, the apparatus must be adjusted so that the rate of deposition of layer 23 exceeds the rate of re-emission from layer 23 as a result of resputtering. This will provide the gradual buildup of layer 23 into the intermediate structure with a step ridge 14A and the peak ridge 14B shown in FIG. 1B. The structure at an intermediate stage (also comprehended in this invention) is shown in FIG. 2H where there is marked narrow elevations in the form of the peaked ridge 14A in said layer. As the resputtering is continued at the same rate until the structure shown in FIG. 1B is obtained with a modified ridge in the form of the peaked ridge 14B as shown in FIG. 1B.

Figure 4:
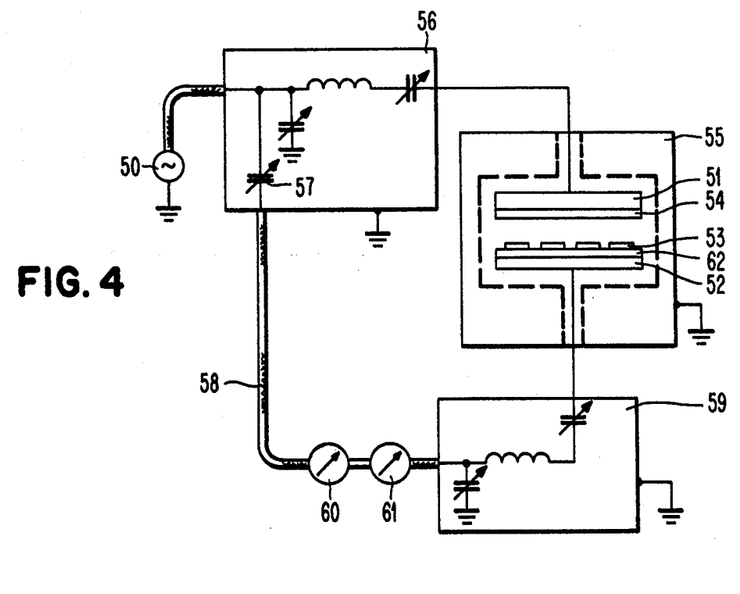
FIG. 4 is a diagrammatic drawing illustrative of known resputtering apparatus which can be employed in depositing insulation layers, such as quartz, on integrated circuit structures.

As previously mentioned, prior art apparatus shown in FIG. 4 may be utilized in the partial planarization techniques of the present method. This apparatus was described in IBM Technical Disclosure Bulletin, September 1971, page 1032, entitled "Power Networks for Substrate" by R. P. Auyang et al. The RF sputtering system shown has a power splitting circuit for a driven RF system with independent controls for resputtering power and for the electrical phase between the cathode and the wafer holder. Briefly, RF generator 50 supplies power to target electrode 51 supporting a target 54 of the silicon dioxide material to be deposited on the integrated circuit wafers 53 supported on electrode 52. The electrodes and supporting structures are contained in a conventional vacuum chamber 55 which may conveniently be of the type shown in FIG. 1 of U.S. Pat. No. 3,661,761. Upper matching network 56 includes a coupling capacitor 57 having a magnitude of from 50 to 250 pF which permits continuous adjustment of the power splitting operation. Wafer holder/electrode 52 is driven by a matched 50 ohm transmission cable 58. The lower matching network 59 transforms the input impedance of electrode 52 to a 50 ohm load so that cable 58 functions as a delay line. The electrical phase between electrode 51 and electrode 52 is adjusted for the selected optimum sputtering condition by selecting the appropriate length for cable 58. Because the cable is matched, the effect of resputtering is easily monitored by forward and reflected power meters 60 and 61 as well as by controlling the D.C. bias on the substrate electrode 52. The apparatus of FIG. 4 is, in effect, a driven substrate system with a three-electrode arrangement wherein the chamber walls constitute the third grounded electrode. Consequently, the substrate holders must be isolated. A shielding arrangement should be used to avoid sputtering of unwanted material from the substrate holder. Accordingly, the wafers are placed on a thick quartz plate 62 covering the face of electrode 52. The driven substrate system is therefore operating in a "floating mode". The apparatus of FIG. 5 may be operated under the following average conditions: total power 3.0 to 3.5KW; electrode 51 power about 3.0KW; electrode 52 power about 0.5KW; chamber argon pressure about 25 microns; delay line length about 32 feet; spacing of about 1.0 inches between about 20 inches dia. electrodes, and a resputtering coefficient of about 0.6 which produces a deposition rate of 150 to 200 Angstroms per minute. Operating under the conditions described and utilizing a metallization system wherein the thickness of the metallization lines are 10,000 Angstroms high and 200 microns wide, and the final thickness of the major portions of quartz layer 23 is about 24,000 Angstroms, a residual crest 14B of about 4,000 Angstroms results on the conductor runs.

Next, utilizing conventional photolithographic selective etching techniques, as described in U.S. Pat. No. 3,539,876, a photoresist layer 26 is formed over the quartz layer 23 with openings 27 corresponding to the via holes to be formed, FIG. 2C. In contrast with prior practices, the opening 27 (through resist layer 26) is circumscribed between step ridges 14B (see FIG. 2C) in register with the spacing 114 between conductor portions 14B. Next, using a conventional chemical etchant for quartz, such as buffered HF, via hole 28 is etched down to the upper surface of narrow metallic line 20 to expose the top adjacent surface segments 222 of each conductor portion 143 to provide the structure shown in FIG. 2D. On removal of the photoresist layer, the resultant structure is shown in FIG. 2E in readiness for receiving a coating of a higher level metallization pattern.

Figure 3A:
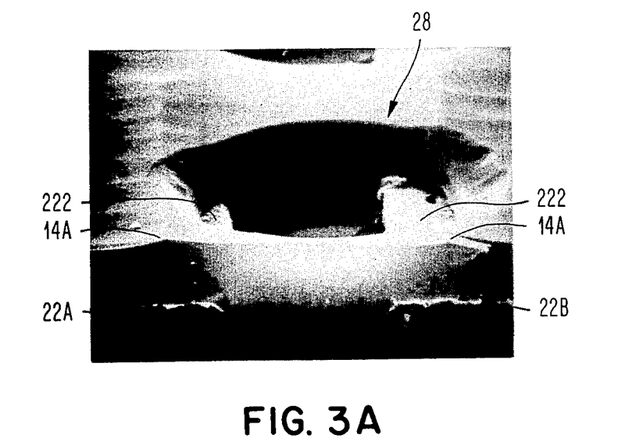
FIGS. 3A-3B and 3C are reproductions of structures formed in accordance with this invention.
Figure 3B:
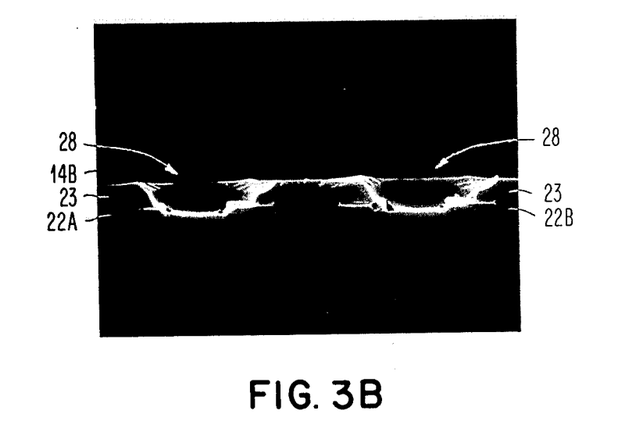
Figure 3C:
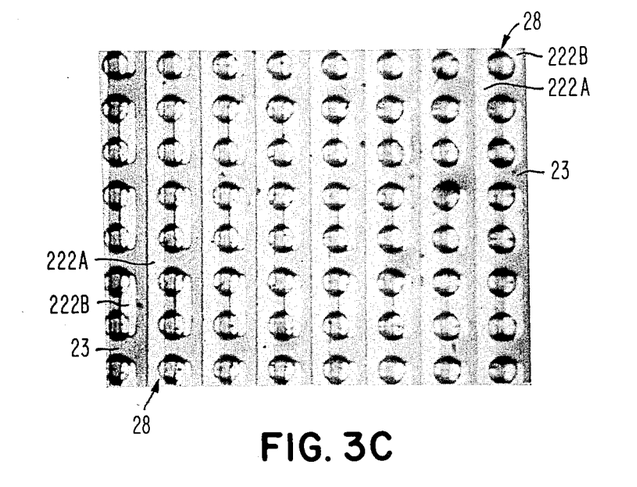

In the structure reproduced in FIGS. 3A and 3B, the conductor portions 22A and 22B are each 150 microinches wide and 10,000 Angstroms high with 150 microinches spacing between them. Also, the quartz peak ridges 14B are about 300 microinches apart (e.g. spacing between them, with a total height of about 14,000 Angstroms above the conductor portions 22A and 22B. Via hole 28 is of concave cross-sectional configuration and is developed by photolithographic techniques, with a surface or top diameter of about 300 microinches, and a bottom diameter of about 220 microinches.

Figure 2F:
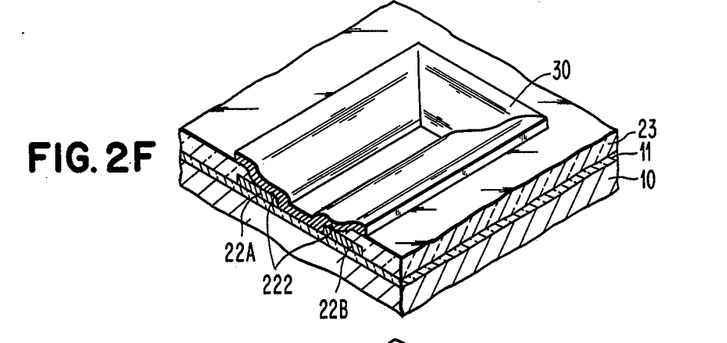
Figure 2G:
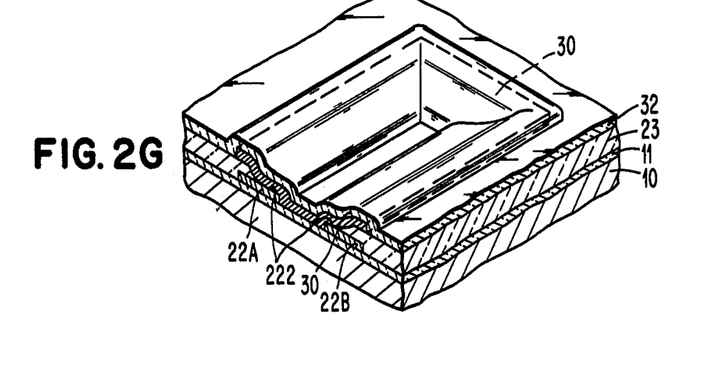
Figure 2H:
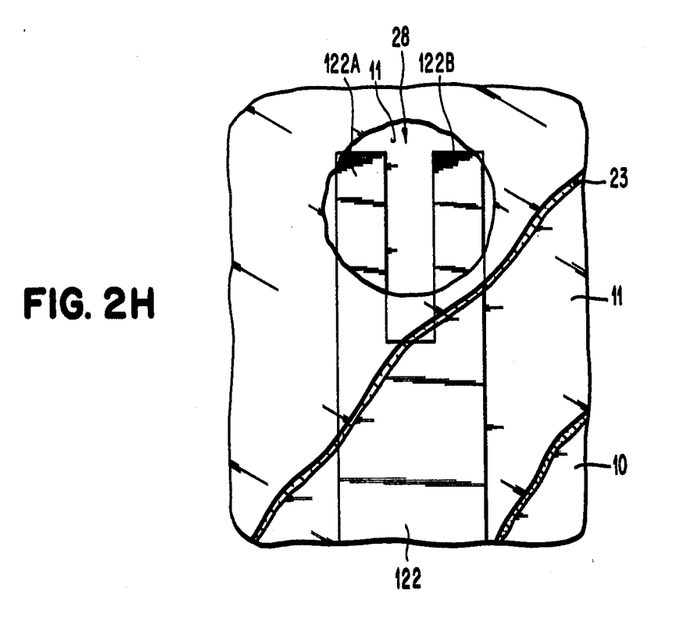

Next, as shown in FIG. 2F, appropriate metallization 30 is deposited in via hole 28; the specific metallization 30 shown comprises a contact member (which can form an extension of a metalic pattern [not shown] which may provide another level of metallization on the surface of layer 23). As will be appreciated, the metallurgy (for the higher level conductor pattern) will normally be formed as a continuous layer over the quartz layer 23 which will extend into the via hole 28 in contact with the sides and exposed top surface segments 222 of conductor portions 22A and 22B with electrical continuity between them, and with disregard of the residual quartz coating retained on the remaining lateral segments of the conductor portions 22A and 22B which can include peak ridges of the quartz, see FIGS. 3A and 3B. The metal coating may then be delineated by conventional photolithographic techniques into the desired conductor pattern. The metal utilized for metallization of 30 and 31 may be any one of the metals previously described as utilizable for metallization lines 20 and 22. An additional layer 32 of insulative material, such as silicon dioxide or silicon nitride, is deposited over layer 23 and the metallization.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. In a semiconductor integrated circuit array comprising a semiconductor substrate, a dielectric layer on said substrate, a plurality of semiconductor devices integrated in said substrate, and an electrical conductor pattern on said layer electrically connected to at least one of said devices, the improvement comprising
   (A) at least one selected discrete region of said pattern comprising a plurality of spaced portions for electrical connection to each other wherein said portions coextend over and on an imperforate portion of said layer,
   (B) a dielectric coating over said conductor pattern and said layer,
   (C) a via opening through said coating extending to and terminating short of said layer, with said via opening in register with the gaps between said portions exposing adjacent segments thereof intermediate and spaced from the outermost lateral edges of said conductor portions, and
   (D) a second conductor pattern extending through said via holes in electrical contact with said segments, including top surface portions thereof, and in dielectric insulated relationship to said substrate in the area of said gap between said portions.

2. The structure of claim 1 wherein said conductor comprises aluminum.

3. The structure of claim 1 wherein said coating comprises quartz.

4. The structure of claim 3 wherein said conductor comprises aluminum.

5. In a semiconductor integrated circuit array comprising a semiconductor substrate, a dielectric layer on said substrate, a plurality of semiconductor devices integrated in said substrate, and an electric conductor pattern on said layer electrically connected to at least one of said devices, the improvement comprising
   (A) at least one selected discrete region of said conductor subdivided into a plurality of spaced segments electrically connected in parallel wherein said segments coextend over and on an imperforate portion of said layer,
   (B) a dielectric coating over said conductors and said layer,
   (C) a via opening through said coating extending to and terminating short of said layer, with said via opening in register with the gaps between said segments exposing portions thereof intermediate and spaced from the outermost lateral edges of said segments, and
   (D) a second conductor pattern extending through said via holes in electrical contact with said segments, including top surface portions thereof, and in dielectric insulated relationship with said substrate in the area of said gaps between said segments.

6. The structure of claim 5 wherein said conductor comprises aluminum.

7. The structure of claim 5 wherein said coating comprises quartz.

8. The structure of claim 7 wherein said conductor comprises aluminum.

9. In a planar semiconductor integrated circuit chip structure having a semiconductor member with a planar surface at which the devices in the circuit are formed and a metallization pattern selectively connected to said surface and disposed on a plurality of levels separated by layers of electrically insulative material above said surface, a via hole interconnected structure comprising (A) a metallization line pattern on a first level with respect to said surface having line portions and having a conductor member comprising a plurality of segments electrically connected in parallel with said segments coextending on and over an imperforate portion of a first said insulative layer, (B) a second electrically insulative layer covering said first level metallization pattern and said first insulative layer, (C) a via hole extending through said second insulative layer extending to and terminating short of said first insulative layer, with said via hole in register with the gaps between said segments exposing portions thereof intermediate and spaced from the outermost lateral edges of said conductor member, (D) a second level metallization pattern on said insulative layer, and (E) metal interconnectors in said via hole connecting said segments, including top surface portions thereof, and said second level pattern with said interconnectors in insulated relationship to said semiconductor member in the area of said gaps between said segments.

10. The structure of claim 9 wherein said conductor comprises aluminum.

11. The structure of claim 9 wherein said insulating layer intermediate said segments and said second level pattern comprises quartz.

12. The structure of claim 11 wherein said conductor comprises aluminum.

13. In a planar semiconductor integrated circuit chip structure having a semiconductor member with a planar surface at which the devices in the circuit are formed and a metallization pattern selectively connected to said surface and disposed on a plurality of levels separated by layers of electrically insulative material above said surface, a via hole interconnected structure comprising (A) a metallization line pattern on a first level with respect to said surface having line portions and having a conductor member subdivided into a plurality of spaced segments electrically connected in parallel with said segments coextending on and over an imperforate portion of a first said insulative layer, (B) a second electrically insulative layer covering said first level metallization pattern and said first insulative layer, (C) a via hole extending through said second insulative layer extending to and terminating short of said first insulative layer, with said via hole in register with the gaps between said segments exposing portions thereof intermediate and spaced from the outermost lateral edges of said conductor member, (D) a second level metallization pattern on said insulative layer, and (E) metal interconnectors in said via hole connecting said segments, including top surface portions thereof, and said second level pattern with said interconnectors in insulated relationship to said semiconductor member in the area of said gaps between said segments.

14. The structure of claim 13 wherein said conductor comprises aluminum.

15. The integrated circuit structure of claim 13 wherein said insulating intermediate said segments and a said adjacent superposed metal pattern comprises quartz.

16. The structure of claim 15 wherein said conductor comprises aluminum.

17. In a planar semiconductor integrated circuit chip structure having a semiconductor member with a planar surface at which the devices in the circuit are formed and a metallization pattern selectively connected to said surface and disposed on a plurality of levels separated by layers of electrically insulative material above said surface, a via hole interconnected structure comprising (A) a metallization line pattern on a first level with respect to said surface having line portions and having a conductor member subdivided into a plurality of spaced segments electrically connected in parallel with said segments coextending on and over an imperforate portion of a first said insulative layer, (B) a second said electrically insulative layer covering said first level metallization pattern and said first insulative layer, (C) a via hole extending through said second insulative layer extending to and terminating short of said first insulative layer, with said via hole in register with the gaps between said segments exposing portions thereof, said via hole being circumscribed within the lateral edges of said conductor member and overlapping said segments, (D) a second level metallization pattern on said insulative layer, and (E) metal interconnectors in said via hole connecting said segments, including top surface portions thereof, and said second level pattern with said interconnector in insulative relationship to said semiconductor member in the area of said gaps between said segments.

18. The structure of claim 17 wherein said conductor comprises aluminum.

19. The integrated circuit structure of claim 17 wherein said insulating layer intermediate said segments and said second level pattern comprises quartz.

20. The structure of claim 19 wherein said conductor comprises aluminum.

* * * * *